(12) United States Patent
Murayama et al.

(10) Patent No.: US 12,338,987 B2
(45) Date of Patent: Jun. 24, 2025

(54) HEATSINK, ACTIVE ENERGY IRRADIATION DEVICE, AND ACTIVE ENERGY IRRADIATION SYSTEM

(71) Applicant: HAMAMATSU PHOTONICS K.K., Hamamatsu (JP)

(72) Inventors: Kyoichi Murayama, Hamamatsu (JP); Keita Umeno, Hamamatsu (JP)

(73) Assignee: HAMAMATSU PHOTONICS K.K., Hamamatsu (JP)

( * ) Notice: Subject to any disclaimer, the term of this patent is extended or adjusted under 35 U.S.C. 154(b) by 217 days.

(21) Appl. No.: 18/268,429

(22) PCT Filed: May 26, 2021

(86) PCT No.: PCT/JP2021/020055
§ 371 (c)(1),
(2) Date: Jun. 20, 2023

(87) PCT Pub. No.: WO2022/137596
PCT Pub. Date: Jun. 30, 2022

(65) Prior Publication Data
US 2023/0392779 A1 Dec. 7, 2023

(30) Foreign Application Priority Data
Dec. 24, 2020 (JP) ................. 2020-215348

(51) Int. Cl.
*F21V 29/83* (2015.01)
*F21V 29/60* (2015.01)
(Continued)

(52) U.S. Cl.
CPC .............. *F21V 29/83* (2015.01); *F21V 29/60* (2015.01); *F21V 29/713* (2015.01); *F21V 29/76* (2015.01);
(Continued)

(58) Field of Classification Search
CPC ........ F21V 29/83; F21V 29/60; H01L 23/427; H01L 21/4882; F28F 2215/00; F28F 2215/04; F28D 15/0275
(Continued)

(56) References Cited

U.S. PATENT DOCUMENTS

| 6,351,384 B1 | 2/2002 | Daikoku et al. |
| 7,924,567 B2 * | 4/2011 | Zha ........................ H01L 23/467 174/16.3 |

(Continued)

FOREIGN PATENT DOCUMENTS

| CN | 102097401 A | 6/2011 |
| JP | 2001-053206 A | 2/2001 |

(Continued)

OTHER PUBLICATIONS

International Preliminary Report on Patentability mailed Jul. 6, 2023 for PCT/JP2021/020055.
(Continued)

*Primary Examiner* — Jon T. Schermerhorn, Jr.
(74) *Attorney, Agent, or Firm* — Faegre Drinker Biddle & Reath LLP

(57) ABSTRACT

A heatsink includes: a base plate thermally connected to a heat-generating unit; a plurality of heat radiation fins erected on a surface of the base plate, and arranged with gaps in a first direction along the surface; and a partition member provided to intersect the plurality of heat radiation fins, and partitioning the plurality of heat radiation fins in a second direction along the surface and intersecting the first direction. The partition member partitions the plurality of heat radiation fins such that more air passes through in the second direction between the plurality of heat radiation fins on a base plate side than on a side opposite to the base plate side.

17 Claims, 15 Drawing Sheets

(51) Int. Cl.
*F21V 29/71* (2015.01)
*F21V 29/76* (2015.01)
*F21Y 115/10* (2016.01)
*H01L 23/427* (2006.01)

(52) U.S. Cl.
CPC ......... *H01L 23/427* (2013.01); *F21Y 2115/10* (2016.08); *F28F 2215/00* (2013.01)

(58) Field of Classification Search
USPC ........................................................ 165/185
See application file for complete search history.

(56) References Cited

U.S. PATENT DOCUMENTS

| | | | | |
|---|---|---|---|---|
| 8,408,285 | B2 * | 4/2013 | Lian | H01L 23/427 |
| | | | | 165/185 |
| 11,262,140 | B2 * | 3/2022 | Liu | H01L 21/4878 |
| 2006/0011329 | A1 | 1/2006 | Wang et al. | |
| 2007/0000646 | A1 | 1/2007 | Chen et al. | |
| 2008/0216990 | A1 | 9/2008 | Min et al. | |
| 2011/0024087 | A1 * | 2/2011 | Lin | H01L 23/467 |
| | | | | 165/182 |
| 2011/0277965 | A1 * | 11/2011 | Lin | H01L 23/427 |
| | | | | 165/185 |
| 2012/0067554 | A1 * | 3/2012 | Chen | F28D 15/0275 |
| | | | | 165/138 |
| 2013/0105132 | A1 * | 5/2013 | Huang | H01L 21/4882 |
| | | | | 165/185 |

FOREIGN PATENT DOCUMENTS

| | | |
|---|---|---|
| JP | 2001-118972 A | 4/2001 |
| JP | 2005-079349 A | 3/2005 |
| JP | 2011-108683 A | 6/2011 |
| JP | 2011-138974 A | 7/2011 |
| JP | 2012-156322 A | 8/2012 |
| JP | 2013-143488 A | 7/2013 |
| JP | 2018-110211 A | 7/2018 |
| JP | 2018-140342 A | 9/2018 |
| JP | 2019-057471 A | 4/2019 |

OTHER PUBLICATIONS

Extended European Search Report issued on Jan. 30, 2025 in corresponding European patent application 21909757.3 (12 pages).

* cited by examiner

Fig.11
(a)
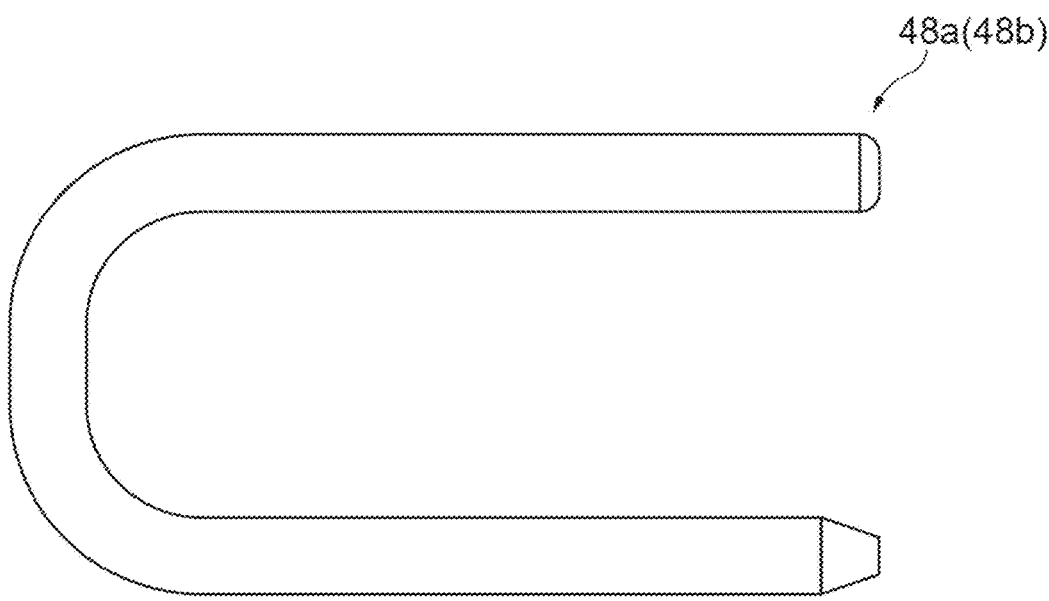
(b)
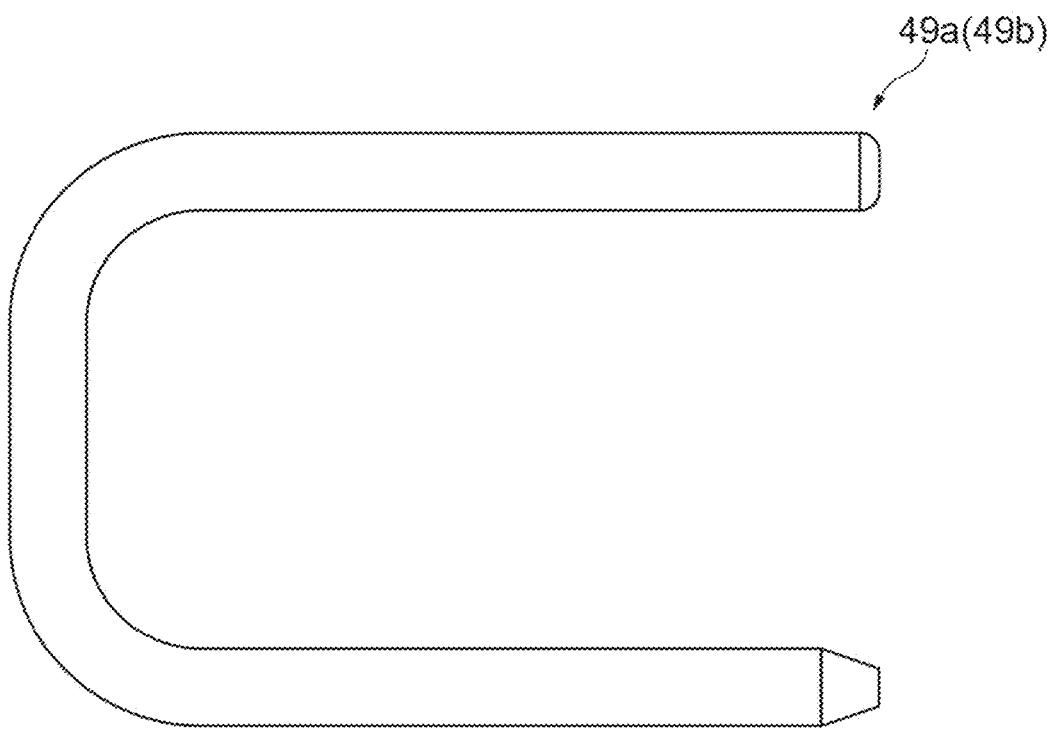

HEATSINK, ACTIVE ENERGY IRRADIATION DEVICE, AND ACTIVE ENERGY IRRADIATION SYSTEM

TECHNICAL FIELD

The present disclosure relates to a heatsink, an active energy irradiation device, and an active energy irradiation system.

BACKGROUND ART

In the related art, a heatsink has been known that includes a base plate thermally connected to a heat-generating unit, and a plurality of heat radiation fins erected on a surface of the base plate, and arranged with gaps in a first direction along the surface (for example, refer to Patent Literature 1).

CITATION LIST

Patent Literature

Patent Literature 1: Japanese Unexamined Patent Publication No. 2001-118972

SUMMARY OF INVENTION

Technical Problem

In the heatsink as described above, for example, even when the amount of heat generated by the heat-generating unit increases, it is desirable to enhance cooling efficiency in order to realize downsizing and weight reduction.

An object of the present disclosure is to provide a heatsink, an active energy irradiation device, and an active energy irradiation system capable of enhancing cooling efficiency.

Solution to Problem

According to one aspect of the present disclosure, there is provided a heatsink including: a base plate thermally connected to a heat-generating unit; a plurality of heat radiation fins erected on a surface of the base plate, and arranged with gaps in a first direction along the surface; and a partition member provided to intersect the plurality of heat radiation fins, and partitioning the plurality of heat radiation fins in a second direction along the surface and intersecting the first direction. The partition member partitions the plurality of heat radiation fins such that more air passes through in the second direction between the plurality of heat radiation fins on a base plate side than on a side opposite to the base plate side.

In this heatsink, for example, when the air flows into the plurality of heat radiation fins from the side opposite to the base plate side, due to the presence of the partition member, the air flows to the base plate side between the plurality of heat radiation fins, and then flows in the second direction, turns, and flows to a side away from the base plate. Therefore, the air can effectively flow between the plurality of heat radiation fins, and the cooling efficiency can be enhanced.

In the heatsink according to one aspect of the present disclosure, an end on the base plate side of the partition member may be spaced apart from the base plate. In this case, a space allowing the air to pass through can be created between the end on the base plate side of the partition member and the base plate. A configuration can be specifically realized in which more air passes through in the second direction between the plurality of heat radiation fins on the base plate side than on the side opposite to the base plate side.

In the heatsink according to one aspect of the present disclosure, a ventilation portion allowing the air to pass through may be provided on the base plate side of the partition member. In this case, the ventilation portion can be used as a space through which the air passes. The configuration can be specifically realized in which more air passes through in the second direction between the plurality of heat radiation fins on the base plate side than on the side opposite to the base plate side.

In the heatsink according to one aspect of the present disclosure, the partition member may include a mesh portion, and the base plate side of the mesh portion may have a larger opening ratio than an opening ratio of the side opposite to the base plate side in the mesh portion. In this case, the mesh portion can be used as a space through which the air passes, and the base plate side of the mesh portion can be used as a space through which more air passes. The configuration can be specifically realized in which more air passes through in the second direction between the plurality of heat radiation fins on the base plate side than on the side opposite to the base plate side.

In the heatsink according to one aspect of the present disclosure, the partition member may be brazed to the plurality of heat radiation fins. Accordingly, the plurality of heat radiation fins and the partition member are thermally connected, so that heat of the plurality of heat radiation fins can be effectively diffused by the partition member.

In the heatsink according to one aspect of the present disclosure, a slit that is open on the side opposite to the base plate side may be formed in the plurality of heat radiation fins, and the partition member may be interposed in the slit of the plurality of heat radiation fins. In this case, the partition member can be easily provided.

In the heatsink according to one aspect of the present disclosure, when viewed in the first direction, at least one of a pair of facing sides among sides forming the slit may be bent to enter an inside of the slit. In this case, when the partition member is inserted to be interposed in the slit, inner surfaces of the slit act as a spring (caulking) due to the fact that the side is bent, and reliable contact between the partition member and the heat radiation fins is obtained, so that heat can be effectively transferred therebetween.

In the heatsink according to one aspect of the present disclosure, a pair of the partition members may be provided spaced apart from each other. In this case, the pair of partition members can partition the plurality of heat radiation fins.

The heatsink according to one aspect of the present disclosure may further include a heat pipe provided to be embedded in the plurality of heat radiation fins and thermally connected to the plurality of heat radiation fins. In this case, heat can be effectively radiated using the heat pipe.

In the heatsink according to one aspect of the present disclosure, the heat pipe may include a pair of first heat pipes provided spaced apart from each other so as to be embedded in the plurality of heat radiation fins, and a pair of second heat pipes provided spaced apart from each other so as to be embedded between the pair of first heat pipes in the plurality of heat radiation fins, and longer than the first heat pipes. The partition members may be each provided between one first heat pipe and one second heat pipe adjacent to each other and between the other first heat pipe and the other second heat pipe adjacent to each other. In this case, for example, between the plurality of heat radiation fins, the air flowing to the base plate side can come into contact with the first heat pipes, and then the air that turns and flows to a side away from the base plate can come into contact with the second heat pipes. Namely, the air flowing between the plurality of heat radiation fins can come into contact with the first heat pipes in a state where the temperature is still relatively low, and thereafter, in a state where the temperature has risen, the air can come into contact with the second heat pipes having a higher heat radiation capacity than that of the first heat pipes. Accordingly, heat can be uniformly radiated using the heat pipe.

In the heatsink according to one aspect of the present disclosure, grooves that are open on the side opposite to the base plate side may be each formed in the plurality of heat radiation fins. In this case, other members can be engaged with the heat radiation fins using the groove.

According to one aspect of the present disclosure, there is provided an active energy irradiation device including: the heatsink; a plurality of active energy irradiation units thermally connected to the base plate of the heatsink, and arranged at least along a predetermined direction; and a housing that houses the heatsink and the active energy irradiation units. A flow path allowing the air to flow into the gaps between the plurality of heat radiation fins from the side opposite to the base plate side may be provided inside the housing.

In this active energy irradiation device, the air that has flowed to the heatsink flows to the base plate side between the plurality of heat radiation fins, and then turns in the second direction, and flows to a side away from the base plate between the plurality of heat radiation fins. Therefore, the air can effectively flow between the plurality of heat radiation fins, and the cooling efficiency can be enhanced.

According to one aspect of the present disclosure, there is provided an active energy irradiation device including: the heatsink; a plurality of active energy irradiation units thermally connected to the base plate of the heatsink, and arranged at least along a predetermined direction; and a housing that houses the heatsink and the active energy irradiation units. The pair of partition members of the heatsink partition the plurality of heat radiation fins of the heatsink into a pair of outer portions located outside in the predetermined direction and an inner portion located between the pair of outer portions. A flow path allowing the air to flow into the gaps between the plurality of heat radiation fins in the pair of outer portions from the side opposite to the base plate side is provided inside the housing.

In this active energy irradiation device, the air that has flowed into the plurality of heat radiation fins of the heatsink flows to the base plate side between the plurality of heat radiation fins in each of the pair of outer portions, and then turns in the second direction, merges, and flows to a side away from the base plate between the plurality of heat radiation fins in the inner portion. Therefore, the air can effectively flow between the plurality of heat radiation fins, and the cooling efficiency can be enhanced.

According to one aspect of the present disclosure, there is provided an active energy irradiation device including: the heatsink; a plurality of active energy irradiation units thermally connected to the base plate of the heatsink, and arranged at least along a predetermined direction; a housing that houses the heatsink and the active energy irradiation units; an exhaust unit that is provided in the housing, and that discharges the air, which has passed through the heatsink, to an outside of the housing; and a duct provided between the heatsink and the exhaust unit inside the housing, and allowing the air, which has passed through the heatsink, to flow through to the exhaust unit. One end portion on the base plate side of the duct is inserted into the grooves.

In this active energy irradiation device, the air that has flowed into the plurality of heat radiation fins of the heatsink flows to the base plate side between the plurality of heat radiation fins in one of a first portion and a second portion, and then turns in the second direction, and flows to a side away from the base plate between the plurality of heat radiation fins in the other of the first portion and the second portion. Therefore, the air can effectively flow between the plurality of heat radiation fins, and the cooling efficiency can be enhanced. In addition, the duct can be engaged with the heat radiation fins using the groove, and the need for a seal member such as a packing at a connection between the duct and the heat radiation fins can be eliminated.

In the active energy irradiation device according to one aspect of the present disclosure, the one end portion on the base plate side of the duct may be inserted into the grooves through a heat conductive material. In this case, heat can be effectively transferred from the plurality of heat radiation fins to the duct.

In the active energy irradiation device according to one aspect of the present disclosure, the active energy irradiation units may perform irradiation with an ultraviolet ray or an electron beam. Accordingly, the active energy irradiation device can be used as a device that performs irradiation with an ultraviolet ray or an electron beam.

According to one aspect of the present disclosure, there is provided an active energy irradiation system including: a plurality of the active energy irradiation devices. The plurality of active energy irradiation devices are arranged to be in contact with each other in the predetermined direction.

When the plurality of active energy irradiation devices are arranged to be in contact with each other in the predetermined direction, in each of the active energy irradiation devices, due to the influence of other adjacent active energy irradiation devices, the plurality of active energy irradiation units are likely to become overheated (particularly, the plurality of active energy irradiation units are likely to become overheated that are located at both end portions in the predetermined direction among the plurality of active energy irradiation units). In this respect, since the active energy irradiation system according to one aspect of the present disclosure includes the active energy irradiation system, the cooling efficiency can be enhanced, so that the overheating of the plurality of active energy irradiation units can be suppressed.

Advantageous Effects of Invention

According to the present disclosure, it is possible to provide the heatsink, the active energy irradiation device, and the active energy irradiation system capable of enhancing cooling efficiency.

BRIEF DESCRIPTION OF DRAWINGS

FIG. 11(a) is a front view of a first heat pipe of the heatsink illustrated in FIG. 4. FIG. 11(b) is a front view of a second heat pipe of the heatsink illustrated in FIG. 4.

DESCRIPTION OF EMBODIMENTS

Figure 1:
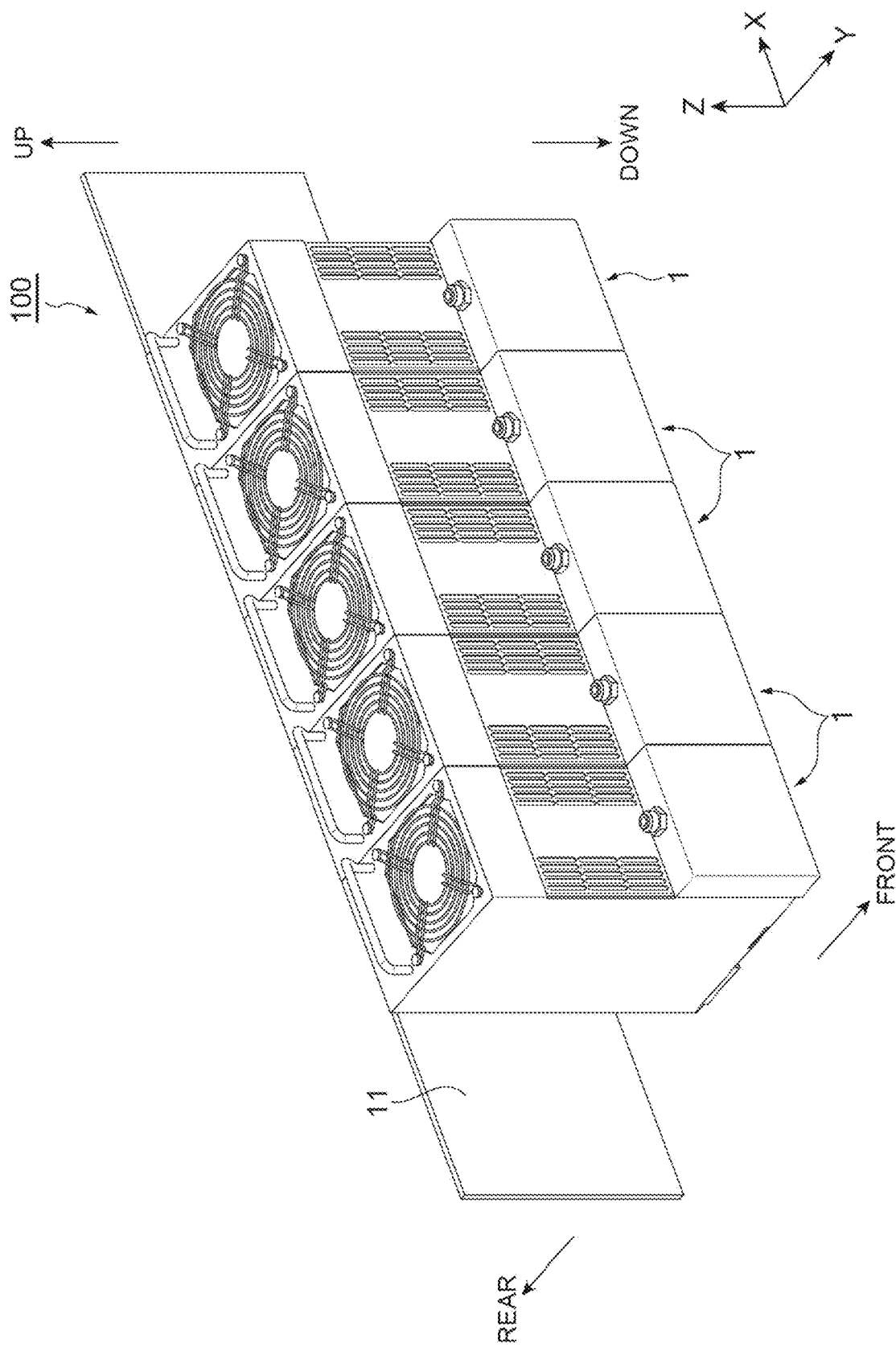
FIG. 1 is a perspective view of an active energy irradiation system according to one embodiment.
Figure 2:
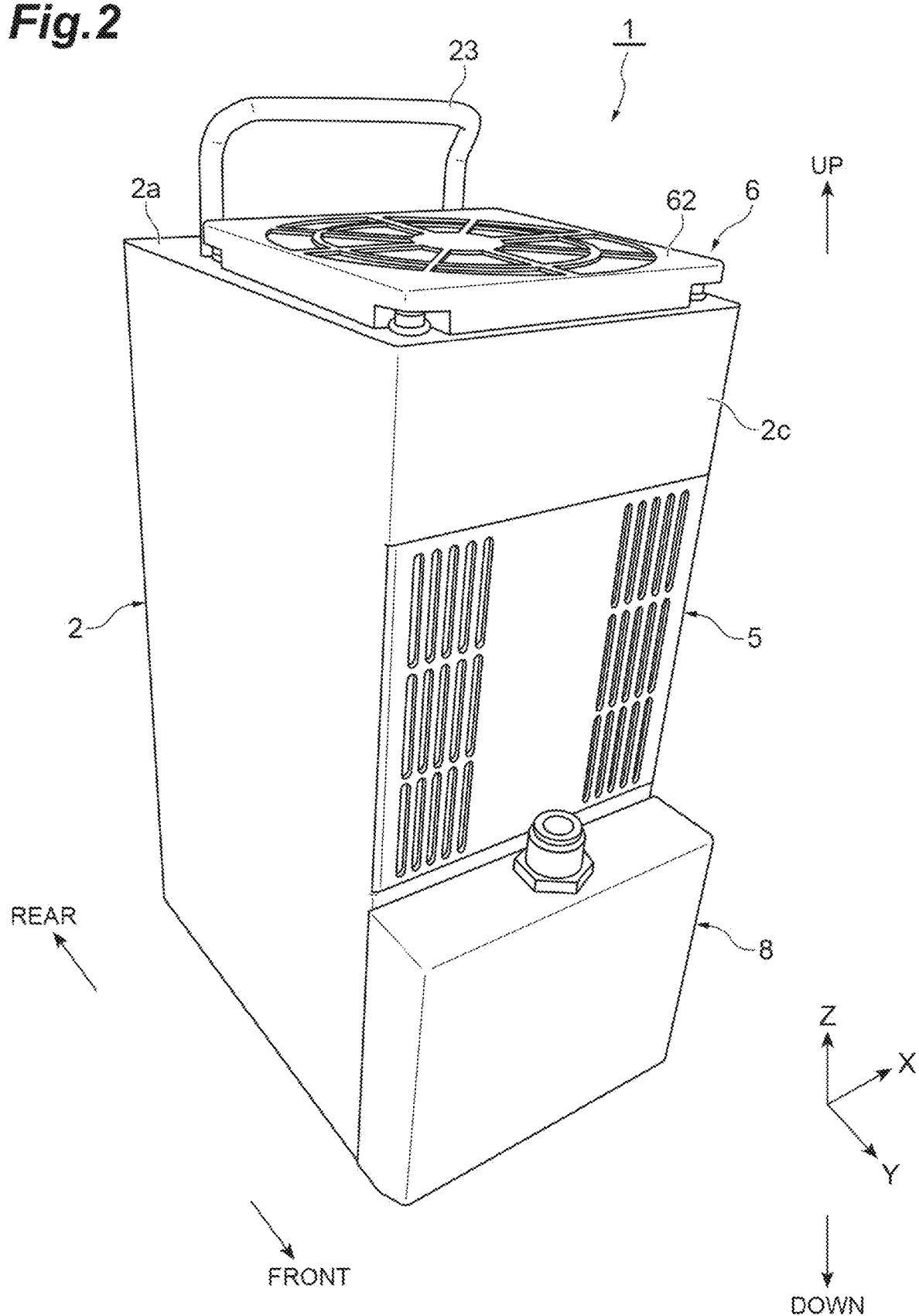
FIG. 2 is a perspective view of an active energy irradiation device illustrated in FIG. 1.
Figure 3:
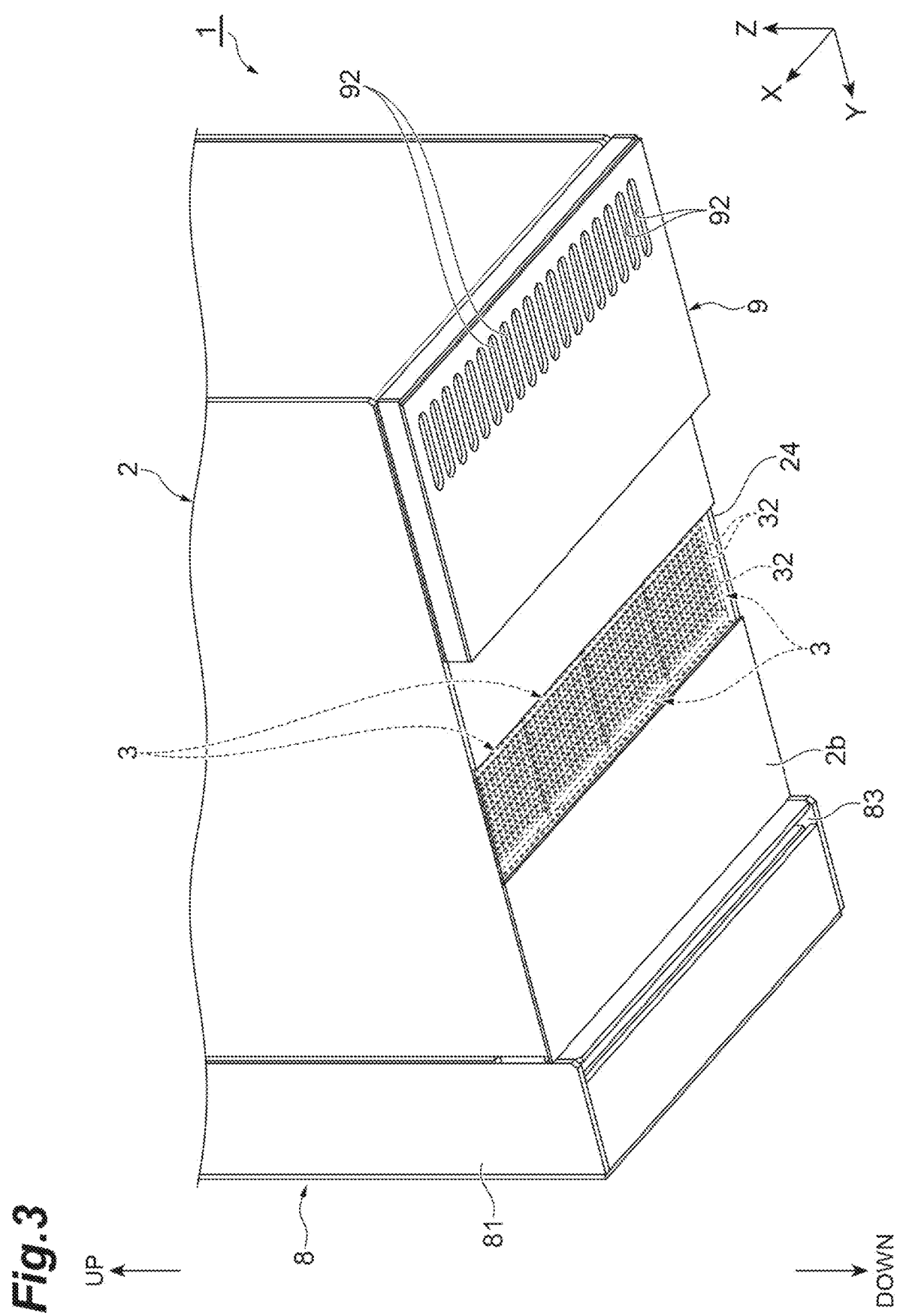
FIG. 3 is a perspective view of the active energy irradiation device illustrated in FIG. 2 when viewed from below.
Figure 4:
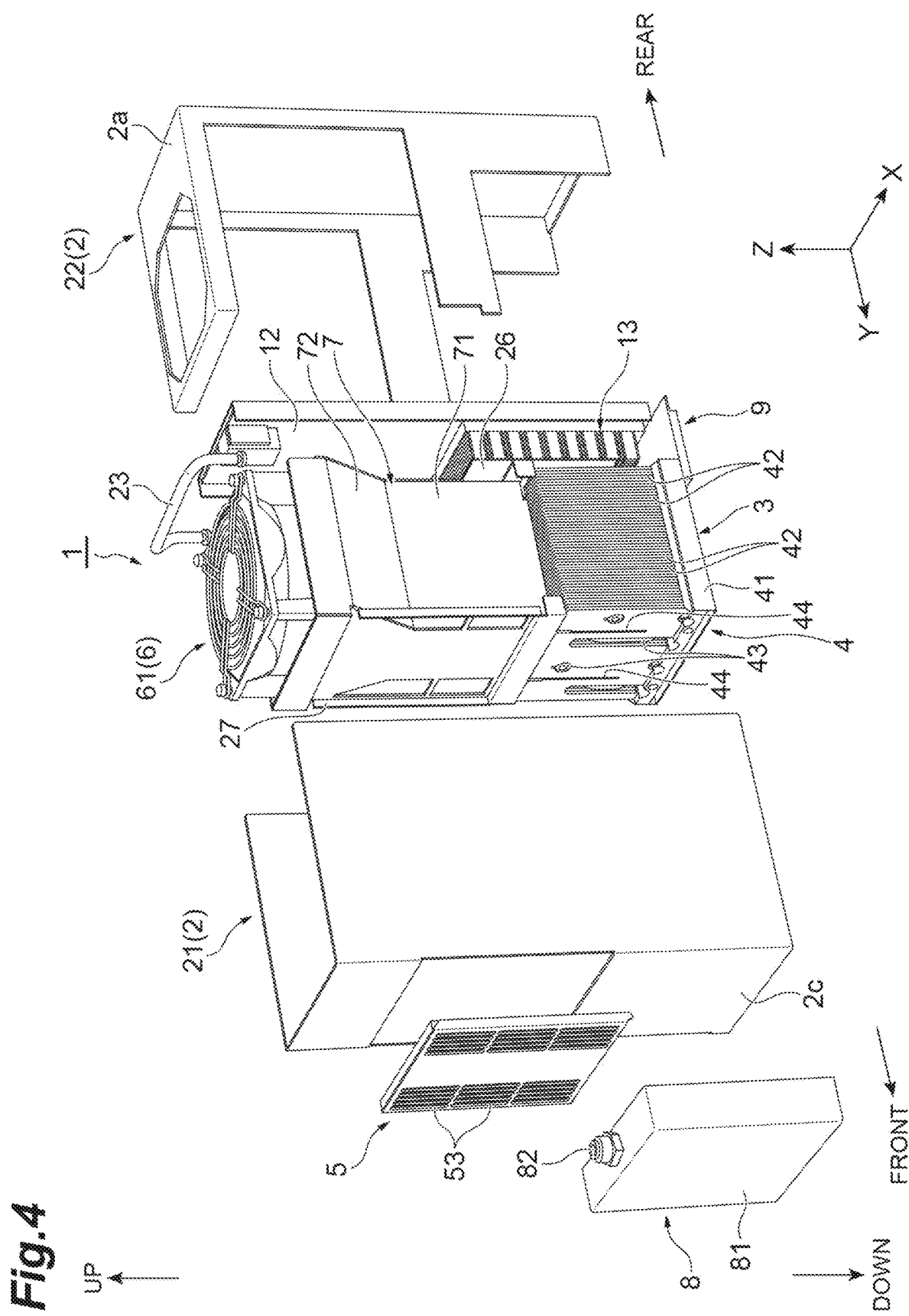
FIG. 4 is an exploded perspective view of the active energy irradiation device illustrated in FIG. 2.

Hereinafter, an embodiment of the present disclosure will be described in detail with reference to the drawings. It should be noted that in the drawings, the same or equivalent portions are denoted by the same reference signs, and duplicate descriptions will be omitted.

As illustrated in FIG. 1, an active energy irradiation system 100 is, for example, a system that is installed in an ultraviolet (UV) printer, and includes a plurality of active energy irradiation devices 1. The active energy irradiation devices 1 are, for example, high-output air-cooled LED light sources for printing applications. The active energy irradiation devices 1 irradiate an irradiation target with light (ultraviolet rays, active energy rays) to dry ink on the irradiation target. Examples of the irradiation target include a printed matter to which a photocurable ink is adhered.

The active energy irradiation devices 1 have a rectangular parallelepiped outer shape. The active energy irradiation devices 1 are arranged to be in contact with each other in a predetermined direction. The plurality of active energy irradiation devices 1 arranged in the predetermined direction are fixed and held by a fixing plate 11. As illustrated in FIGS. 2, 3, 4, and 5, the active energy irradiation device 1 includes a housing 2, a plurality of LED substrates 3, a heatsink 4, an intake unit 5, an exhaust unit 6, a duct 7, an inert gas supply unit 8, and an inert gas suction unit 9.

Incidentally, for convenience of description, the predetermined direction in which the plurality of active energy irradiation devices 1 are arranged is defined as an "X direction", a direction perpendicular to the X direction, which is a light emission direction of the active energy irradiation devices 1, is defined as a "Z direction", and a direction orthogonal to the X direction and the Z direction is defined as a "Y direction". A side of the active energy irradiation device 1 from which light is emitted is defined as a "lower side", and the opposite side is defined as an "upper side". One side in the Y direction is defined as a "front side", and the other side in the Y direction is defined as a "rear side".

The housing 2 has a rectangular shape that is elongated in the Z direction. The housing 2 is made of metal. The housing 2 houses the LED substrates 3, the heatsink 4, and the duct 7. The housing 2 is configured by assembling a front casing 21 and a rear casing 22 to each other. A grip portion 23 for grasping the housing 2 is provided on an upper wall 2a of the housing 2. A driver substrate 12 with the Y direction as a thickness direction is disposed on the rear side inside the housing 2. The driver substrate 12 is an electrical driving circuit substrate for driving the active energy irradiation device 1. A driver substrate heatsink 13 that cools transistors and the like of the driver substrate 12 is disposed on the driver substrate 12. The driver substrate heatsink 13 is thermally connected to the transistors and the like of the driver substrate 12.

The LED substrate 3 includes a substrate 31 having a rectangular plate shape and constituting a predetermined circuit (refer to FIG. 8), and LED elements (active energy irradiation units) 32 that are light-emitting elements arranged at predetermined pitches in the X direction and the Y direction on the substrate 31. The LED elements 32 emit light (ultraviolet rays) downward. The LED substrates 3 are disposed at a lower end portion inside the housing 2 with the Z direction as a thickness direction of the substrates 31. The LED substrates 3 are arranged along the X direction. Accordingly, several to several hundred LED elements 32 are arranged at least in the X direction inside the housing 2. The irradiation target moving in the Y direction is irradiated with light emitted from each of the LED elements 32 on the LED substrates 3 through a light irradiation window 24 made of a glass plate and provided on a lower wall 2b of the housing 2.

The heatsink 4 is a heat radiation member thermally connected to the LED elements 32 on the LED substrates 3. The heatsink 4 is an air-cooled heatsink that radiates heat through heat exchange with air. Air constitutes a heat transfer medium (coolant) for cooling the LED elements 32. The heatsink 4 includes a base plate 41, heat radiation fins 42, a heat pipe 43, and a partition plate (partition member) 44.

The base plate 41 has a rectangular plate shape. The plurality of LED substrates 3 are provided on a lower surface of the base plate 41. The lower surface of the base plate 41 is in contact with the substrates 31 of the LED substrates 3. The heat radiation fins 42 have a flat plate shape with the Y direction as a thickness direction. The heat radiation fins 42 are erected on an upper surface (surface) of the base plate 41. The heat radiation fins 42 are arranged to be stacked with gaps therebetween in the Y direction (first direction).

The heat pipe 43 is provided to be embedded in a plurality of the heat radiation fins 42. The heat pipe 43 is thermally connected to the plurality of heat radiation fins 42. The partition plate 44 is provided to intersect the plurality of heat radiation fins 42. The partition plate 44 has a flat plate shape with the X direction as a thickness direction. The partition plate 44 partitions the plurality of heat radiation fins 42 in the X direction (second direction). A pair of the partition plates 44 are provided spaced from each other in the X direction on the plurality of heat radiation fins 42. The pair of partition plates 44 partition the plurality of heat radiation fins 42 into a pair of outer portions 42x located outside in the X direction and an inner portion 42y located between the pair of outer portions.

Ends on a base plate 41 side of the partition plates 44 are spaced apart from the base plate 41. Namely, the partition plates 44 partition the plurality of heat radiation fins 42 such that more air passes through in the X direction between the plurality of heat radiation fins 42 on the lower side (base plate 41 side) than on the upper side (side opposite to the base plate 41 side). The partition plates 44 are brazed and fixed to the plurality of heat radiation fins 42. The heatsink 4 is attached to the housing 2 through a bracket 25 and a support frame 26 (refer to FIG. 7). The intake unit 5 introduces air from outside the housing 2 into the housing 2. The intake unit 5 introduces the air into a buffer space BF to be described later inside the housing 2. The intake unit 5 is provided on a portion toward an upper side of the center of a wall portion 2c on the front side of the housing 2. The intake unit 5 includes an intake filter (filter unit) 51, a filter holding portion 52, and intake ports 53.

As illustrated in FIGS. 4, 5, 6, and 7, the intake filter 51 captures foreign matter (dust and the like) contained in the air introduced into the housing 2. The intake filter 51 is made of, for example, urethane or the like. The intake filter 51 has a rectangular plate-shaped outer shape. The intake filter 51 extends over the portion toward the upper side of the center of the wall portion 2c when viewed from the front. The filter holding portion 52 houses and holds the intake filter 51. The filter holding portion 52 includes an outer plate 52x having a rectangular plate shape with the Y direction as a thickness direction. A front surface of the outer plate 52x is located on the same plane as a front surface of the wall portion 2c of the housing 2. The filter holding portion 52 is detachably attached to the duct 7 and the support frame 27 provided on the duct 7.

The intake ports 53 are through-holes that are open along the Y direction (direction intersecting a direction from the heatsink 4 toward the exhaust unit 6), and that communicate with the inside of the housing 2. The intake ports 53 are arranged in proximity to each other in regions at both end portions in the X direction of the outer plate 52x. The intake ports 53 are through-holes having an elongated hole shape with the Z direction as a longitudinal direction. Air suctioned from the intake ports 53 is introduced into the buffer space BF inside the housing 2 through the intake filter 51 (refer to FIG. 8).

The exhaust unit 6 discharges the air from inside the housing 2 to the outside of the housing 2. The exhaust unit 6 is provided on an upper end portion of the housing 2. The exhaust unit 6 includes a fan 61. For example, an axial fan is used as the fan 61. The fan 61 delivers the air, which is suctioned from the lower side along the Z direction, to the upper side under pressure along the Z direction. The fan 61 is fixed to an upper end portion inside the housing 2. An exhaust filter 62 made of, for example, urethane or the like is attached to the upper wall 2a of the housing 2 located on a discharge side of the fan 61. Incidentally, the exhaust filter 62 is illustrated only in the FIG. 2 for the sake of convenience, and the illustration in the other drawings is omitted. For example, an external pipe for outdoor exhaust (not illustrated) is connected to the discharge side of the fan 61 of the exhaust unit 6.

The duct 7 is provided between the heatsink 4 and the exhaust unit 6 inside the housing 2. The duct 7 allows the air, which has passed through the heatsink 4, to flow through to the exhaust unit 6. The duct 7 allows an inert gas, which has passed through the heatsink 4, to flow through to the exhaust unit 6. The duct 7 has a rectangular pipe shape. The duct 7 includes a linear portion 71 extending in the Z direction with a constant cross-sectional area, and an enlarged portion 72 provided on a downstream side of the linear portion 71 and extending in the Z direction such that the cross-sectional area increases as the enlarged portion 72 extends downstream.

The buffer space BF (refer to FIG. 8) that is a space into which air is introduced from outside by the intake unit 5 is provided on one side and the other side in the X direction of the duct 7 inside the housing 2. The buffer space BF is a space defined by inner surfaces of the housing 2 and outer surfaces of the linear portion 71 and the enlarged portion 72 of the duct 7. Lower end portions of the duct 7 are inserted and fixed to grooves 47 formed in the heat radiation fins 42 of the heatsink 4. An upper end portion of the duct 7 is fixed to a suction side of the fan 61. The duct 7 is attached to the housing 2 through the support frame 27.

As illustrated in FIGS. 2, 3, 4, and 5, the inert gas supply unit 8 supplies inert gas to the outside of the housing 2. Examples of the inert gas include nitrogen. The inert gas supply unit 8 forms a region, which is dominated by the inert gas (region with low oxygen concentration), in a region including an irradiation region of light from the plurality of LED elements 32, by supplying the inert gas. The inert gas supply unit 8 is attached to a lower end portion of the wall portion 2c on the front side of the housing 2. The inert gas supply unit 8 includes a purge housing 81 having a rectangular box shape; a socket 82 provided on an upper end surface of the purge housing 81; and a spray port 83 provided at a lower end portion of the purge housing 81. In the inert gas supply unit 8, the inert gas is introduced from the socket 82 into the purge housing 81, and the inert gas is sprayed from the spray port 83.

The inert gas suction unit 9 suctions the inert gas outside the housing 2, and causes the inert gas to flow into the housing 2. The inert gas suction unit 9 is a structure attached to the housing 2. The inert gas suction unit 9 is detachably attached to a rear side of the lower wall 2b of the housing 2 by fasteners such as screws. The inert gas suction unit 9 includes a suction unit housing 91 having a rectangular box shape; a suction port 92 provided in a lower surface of the suction unit housing 91; and a recovery flow path 93 provided inside the suction unit housing 91 (refer to FIG. 7). In the inert gas suction unit 9, the inert gas is suctioned into the suction unit housing 91 through the suction port 92, and the inert gas is allowed to flow through into the housing 2 by the recovery flow path 93.

Figure 6:
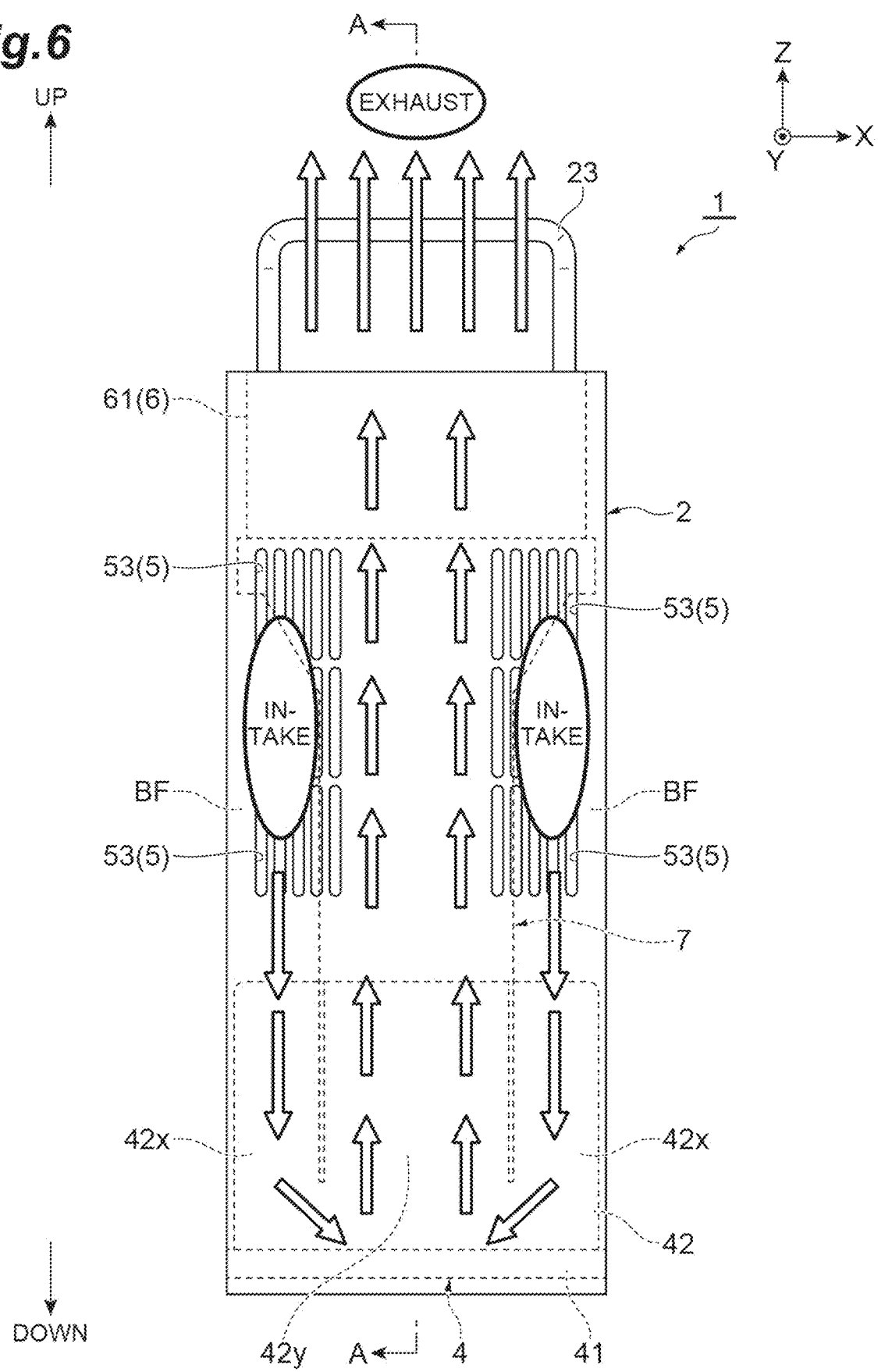
FIG. 6 is a front view illustrating the flows of air in the active energy irradiation device illustrated in FIG. 2.
Figure 7:
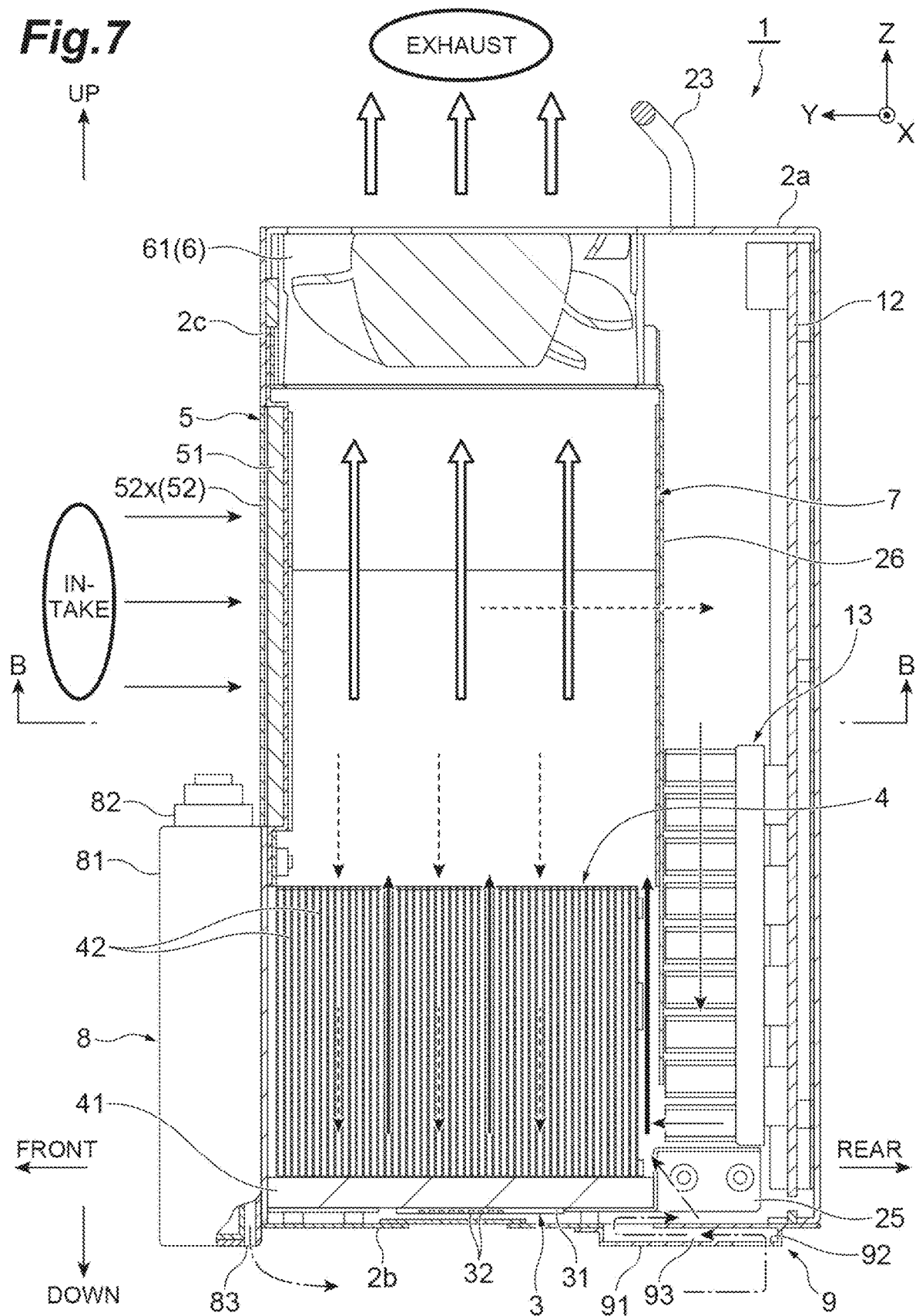
FIG. 7 is a cross-sectional view of the active energy irradiation device taken along line A-A illustrated in FIG. 6.
Figure 8:
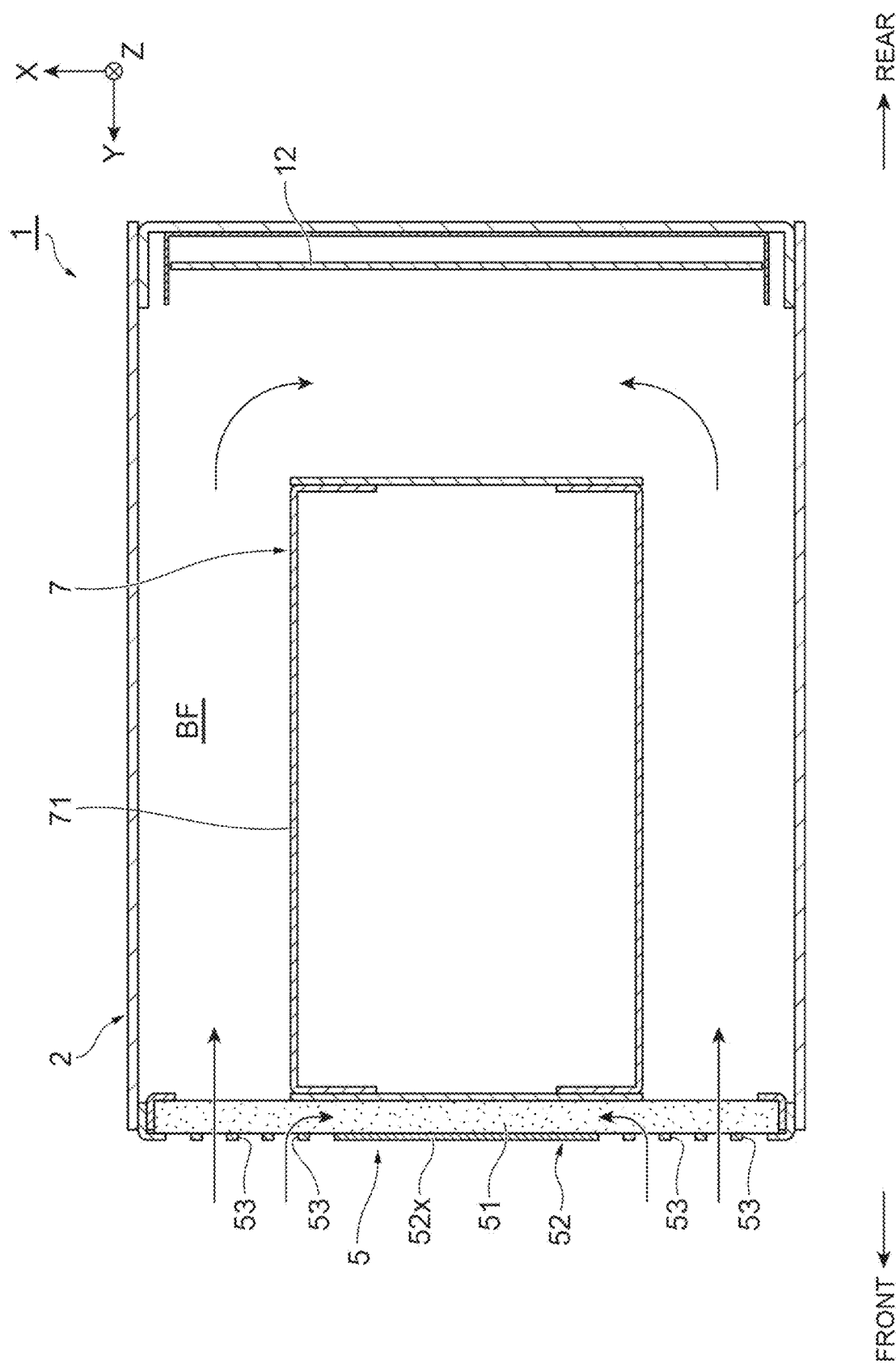
FIG. 8 is an end view of the active energy irradiation device taken along line B-B illustrated in FIG. 7.

As illustrated in FIGS. 6, 7, and 8, in the active energy irradiation device 1, outside air is introduced into the buffer space BF inside the housing 2 by the intake unit 5. The air introduced into the buffer space BF flows downward along the Z direction, and then passes through the heatsink 4 and flows into the duct 7. At this time, in the heatsink 4, the air flows downward along the Z direction between the plurality of heat radiation fins 42 of each of the pair of outer portions 42x, and then flows to pass through between the partition plates 44 and the base plate 41 and to turn upward, and merges at the inner portion 42y. Then, the air flows upward along the Z direction between the plurality of heat radiation fins 42 of the inner portion 42y, and flows into the duct 7.

In addition, the air introduced into the buffer space BF flows downward along the Z direction, and then passes through the driver substrate heatsink 13. The air that has passed through the driver substrate heatsink 13 merges with the flow in the inner portion 42y of the heatsink 4 through a lower rear space inside the housing 2, flows upward along the Z direction between the plurality of heat radiation fins 42 of the inner portion 42y, and flows into the duct 7. The air that has flowed into the duct 7 flows upward along the Z direction, and is discharged to the outside of the housing 2 through the fan 61.

As illustrated in FIG. 7, in the active energy irradiation device 1, the inert gas sprayed from the inert gas supply unit 8 is suctioned by the inert gas suction unit 9, and flows into the housing 2. The inert gas that has flowed into the housing 2 merges with the flow in the inner portion 42y of the heatsink 4 through the lower rear space inside the housing 2, flows upward along the Z direction between the plurality of heat radiation fins 42 of the inner portion 42y, together with the air, and flows into the duct 7. The inert gas that has flowed into the duct 7 flows upward along the Z direction, together with the air, and is discharged to the outside of the housing 2 through the fan 61, together with the air.

In the active energy irradiation device 1 of the present embodiment, as illustrated in FIGS. 9, 10, 11(a), and 11(b), the heat pipe 43 of the heatsink 4 is bent in a U shape and extends when viewed in the X direction. The heat pipe 43 linearly extends in the Z direction when viewed in the Y direction. The heat pipe 43 includes a pair of first heat pipes 48a and 48b provided spaced apart from each other in the X direction, and a pair of second heat pipes 49a and 49b provided spaced apart from each other in the X direction between the pair of first heat pipes 48a and 48b. The second heat pipes 49a and 49b are longer than the first heat pipes 48a and 48b.

Figure 5:
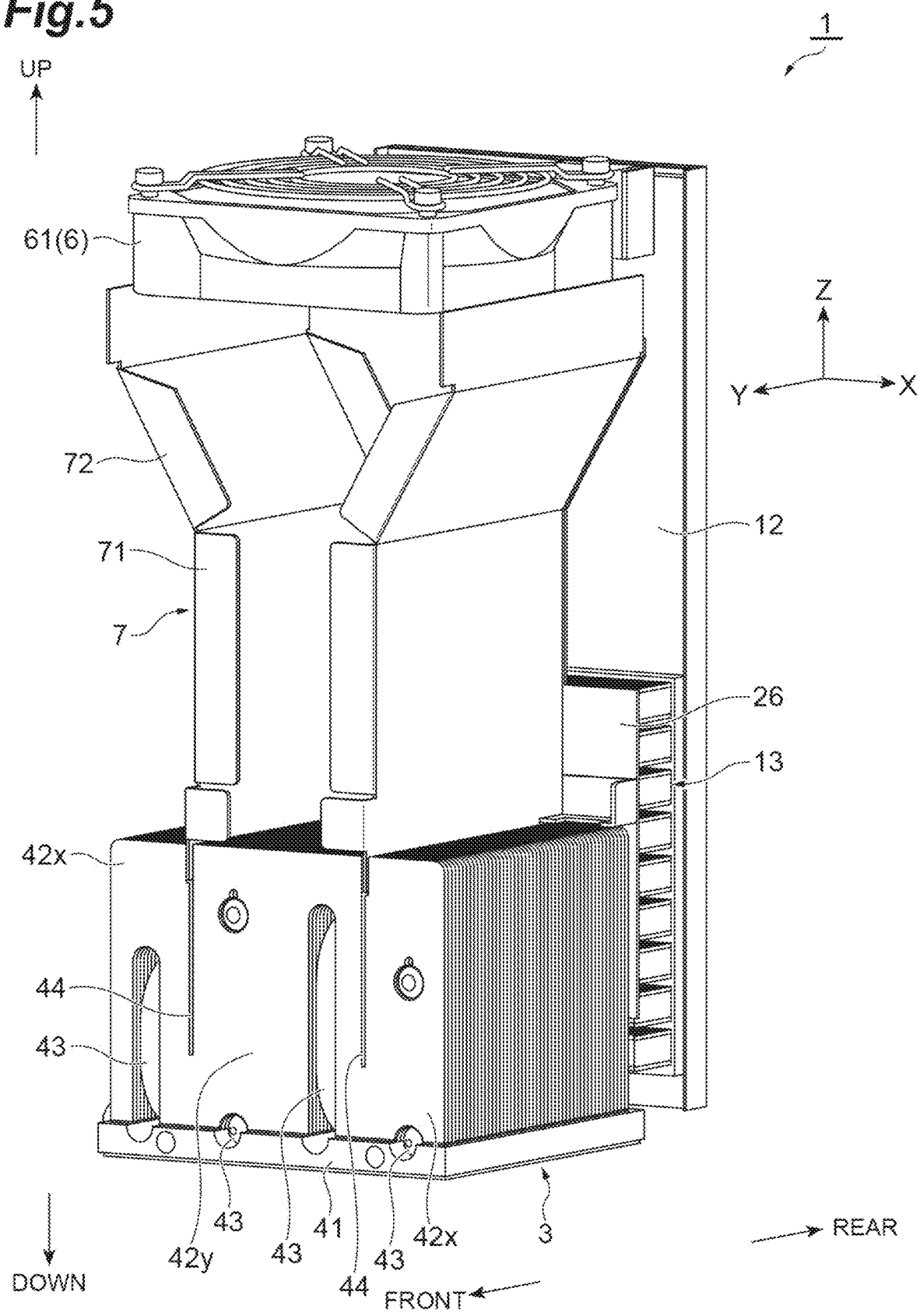
FIG. 5 is a perspective view illustrating an internal configuration of a housing in the active energy irradiation device illustrated in FIG. 2.
Figure 9:
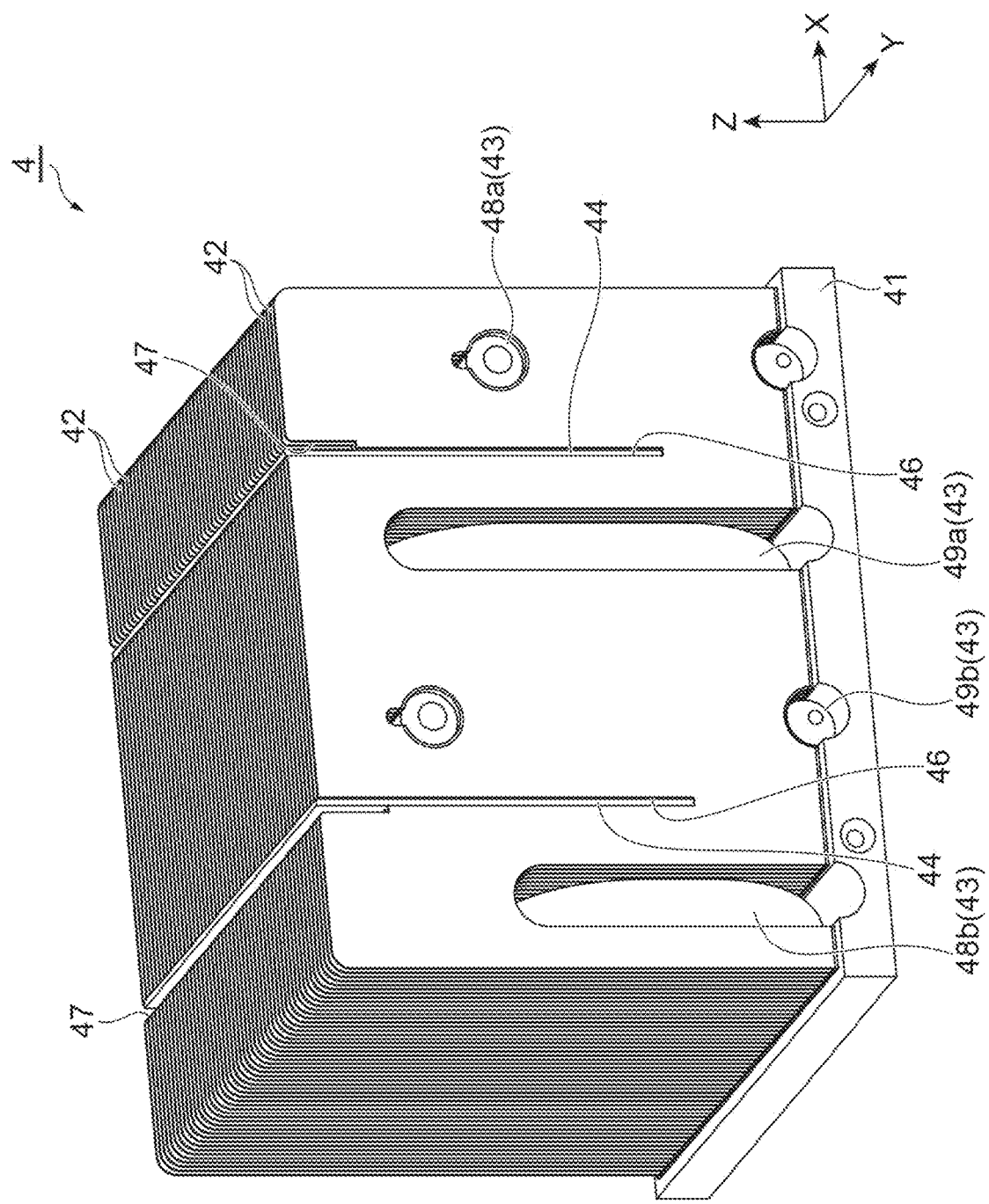
FIG. 9 is a perspective view of a heatsink illustrated in FIG. 4.
Figure 10:
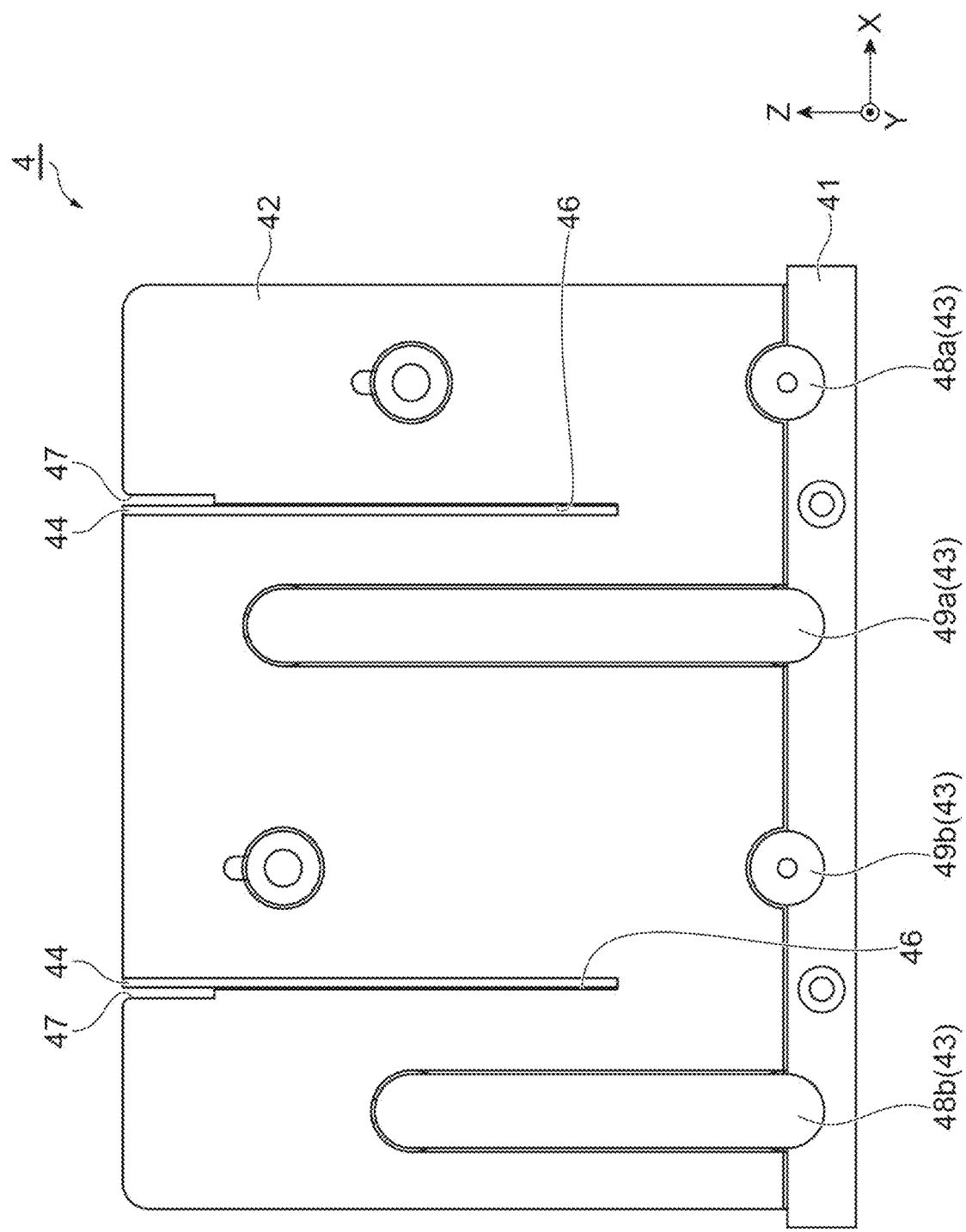
FIG. 10 is a front view of the heatsink illustrated in FIG. 4.

As illustrated in FIGS. 5, 9, and 10, the heat pipes 43 adjacent to each other differ by 180° in the direction of the U shape (direction of an opening side of the U shape). Specifically, the first heat pipe 48a and the second heat pipe 49b that are not adjacent to each other linearly extend rearward along the Y direction so as to be in contact with the base plate 41, and then extend to be bent upward and forward, and linearly extend forward along the Y direction. The first heat pipe 48b and the second heat pipe 49a that are not adjacent to each other linearly extend forward along the Y direction so as to be in contact with the base plate 41, and then extend to be bent upward and rearward, and linearly extend rearward along the Y direction. A linearly extending portion of the heat pipe 43 is brazed and fixed to the plurality of heat radiation fins 42.

The partition plates 44 are provided such that upper end surfaces of the partition plates 44 are located on the same plane as upper end surfaces of the heat radiation fins 42. The partition plates 44 extend such that lower ends of the partition plates 44 are located between the center of the heat radiation fins 42 and the base plate 41 in the Z direction. Namely, as described above, the lower ends of the partition plates 44 are spaced apart from the base plate 41. The partition plates 44 extend to intersect all the heat radiation fins 42 in the Y direction.

The partition plates 44 are interposed in slits 46 formed in the plurality of heat radiation fins 42. The slits 46 are open on the side opposite to the base plate 41 side, and are open in the Y direction. A thickness of the partition plates 44 is less than or equal to a width in the X direction of the slits 46. The slits 46 are each provided between the first heat pipe 48a and the second heat pipe 49a adjacent to each other and between the first heat pipe 48b and the second heat pipe 49b adjacent to each other in the X direction. Namely, the partition plates 44 are each provided between the first heat pipe 48a and the second heat pipe 49a adjacent to each other and between the first heat pipe 48b and the second heat pipe 49b adjacent to each other.

Figure 12:
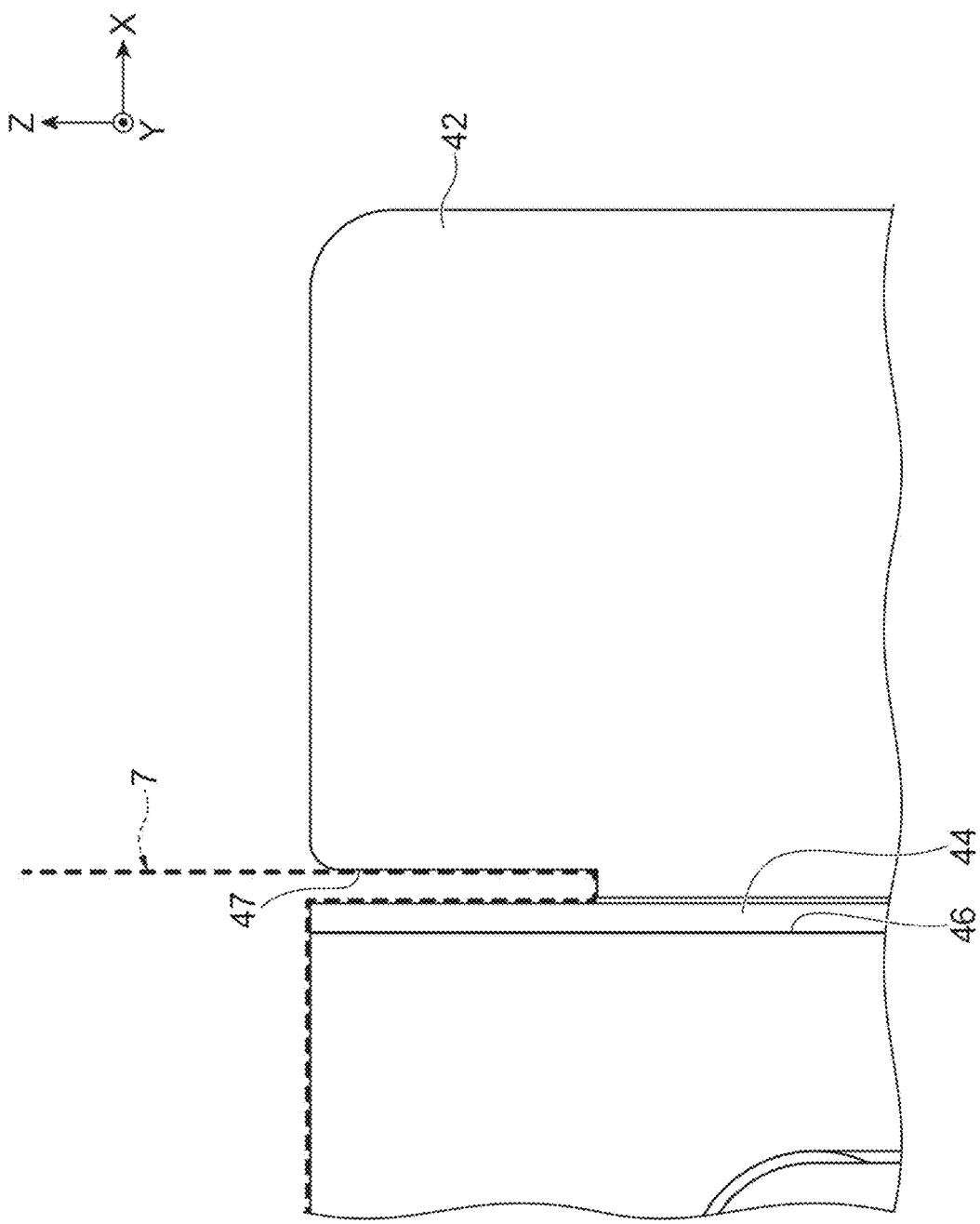
FIG. 12 is a partial enlarged front view of the heatsink illustrated in FIG. 4.

As illustrated in FIGS. 5 and 12, the lower end portions of the duct 7 (end portions on a heatsink 4 side) are inserted into the grooves 47 formed in the heat radiation fins 42 of the heatsink 4. Specifically, at the lower end portions of the duct 7, a pair of side walls facing each other in the X direction (plate-shaped portions with the X direction as a thickness direction) protrude downward. The grooves 47 are open upward and are open in the Y direction. The grooves 47 are provided to continue with the slits 46 at upper end portions of the plurality of heat radiation fins 42.

A thickness of the lower end portion of the duct 7 is less than or equal to a width in the X direction of the groove 47. The lower end portions of the duct 7 are press-fitted into the grooves 47 through a heat conductive grease (heat conductive material). Accordingly, the lower end portions of the duct 7 are fixed to the plurality of heat radiation fins 42 while being thermally connected thereto, and are in overlapping contact with outer sides in the X direction of the partition plates 44. As a result, the inner portion 42y of the plurality of heat radiation fins 42 partitioned off by the partition plates 44 communicates with the inside of the duct 7 in an airtight manner. The heat conductive grease is not particularly limited, and various greases can be used.

As described above, the buffer space BF illustrated in FIG. 8 is formed inside the housing 2. The buffer space BF forms a flow path allowing the air to flow from the upper side into the gaps between the plurality of heat radiation fins 42 in the pair of outer portions 42x of the heatsink 4.

As described above, in the heatsink 4, when the air flows into the plurality of heat radiation fins 42 from the side opposite to the base plate 41 side, due to the presence of the partition plates 44, the air flows to the base plate 41 side between the plurality of heat radiation fins 42, and then flows in the X direction, turns, and flows to a side away from the base plate 41. Therefore, the air can effectively flow between the plurality of heat radiation fins 42, and the cooling efficiency (heat radiation efficiency) can be enhanced. In addition, due to the presence of the partition plates 44, the flows of air between the plurality of heat radiation fins 42 can be rectified, the air can effectively flow, and the cooling efficiency can be enhanced. As a result, the downsizing and weight reduction of the heatsink 4 and the active energy irradiation device 1 including the heatsink 4 can be achieved.

In the heatsink 4, the lower ends of the partition plates 44 are spaced apart from the base plate 41. In this case, a space allowing the air to flow through can be created between the lower end of the partition plates 44 and the base plate 41. A configuration can be specifically realized in which more air can pass through in the X direction between the plurality of heat radiation fins 42 on the base plate 41 side than on the side opposite to the base plate 41 side.

In the heatsink 4, the partition plates 44 are brazed to the plurality of heat radiation fins 42. Accordingly, the plurality of heat radiation fins 42 and the partition plates 44 are thermally connected, so that heat of the plurality of heat radiation fins 42 can be effectively diffused by the partition plates 44.

In the heatsink 4, the slits 46 that are open on the side opposite to the base plate 41 side are formed in the plurality of heat radiation fins 42. The partition plates 44 are interposed in the slits 46 of the plurality of heat radiation fins 42. In this case, the partition plates 44 can be easily provided. The partition plates 44 can be reliably fixed to the plurality of heat radiation fins 42.

In the heatsink 4, the pair of partition plates 44 are provided spaced apart from each other. The pair of partition plates 44 can partition the plurality of heat radiation fins 42.

The heatsink 4 includes the heat pipe 43 provided to be embedded in the plurality of heat radiation fins. In this case, heat can be effectively radiated using the heat pipe 43.

In the heatsink 4, the heat pipe 43 includes the first heat pipes 48a and 48b provided in pair, and the pair of second heat pipes 49a and 49b provided between the pair of first heat pipes 48a and 48b and longer than the first heat pipes 48a and 48b. The partition plates 44 are each provided between the first heat pipe 48a and the second heat pipe 49a adjacent to each other and between the first heat pipe 48b and the second heat pipe 49b adjacent to each other.

In this case, for example, between the plurality of heat radiation fins 42, the air flowing downward can come into contact with the first heat pipes 48a and 48b, and then the air that turns and flows upward can come into contact with the second heat pipes 49a and 49b. Namely, the air flowing between the plurality of heat radiation fins 42 can come into contact with the first heat pipes 48a and 48b in a state where the temperature is still relatively low, and thereafter, in a state where the temperature has risen, the air can come into contact with the second heat pipes 49a and 49b having a higher heat radiation capacity than that of the first heat pipes 48a and 48b. Accordingly, heat can be uniformly radiated using the heat pipe 43.

In the heatsink 4, the grooves 47 that are open upward are each formed in the plurality of heat radiation fins 42. In this case, the duct 7 can be engaged with the heat radiation fins 42 using the grooves 47.

The active energy irradiation device 1 includes the heatsink 4, the LED elements 32, and the housing 2. Inside the housing 2, the buffer space BF is provided as a flow path allowing the air to flow from the upper side into the gaps between the plurality of heat radiation fins 42. Accordingly, the air that has flowed into the heatsink 4 flows to the base plate 41 side between the plurality of heat radiation fins 42, and then turns in the X direction, and flows to the side away from the base plate 41 between the plurality of heat radiation fins 42. Therefore, the air can effectively flow between the plurality of heat radiation fins 42, and the cooling efficiency can be enhanced.

In the active energy irradiation device 1, the pair of partition plates 44 partition the plurality of heat radiation fins 42 of the heatsink 4 into the pair of outer portions 42x and the inner portion 42y therebetween. Inside the housing 2, the buffer space BF is provided as a flow path allowing the air to flow from the upper side into the gaps between the plurality of heat radiation fins 42 in each of the pair of outer portions 42x. Accordingly, the air that has flowed into the heatsink 4 flows to the base plate 41 side between the plurality of heat radiation fins 42 in each of the pair of outer portions 42x, and then turns in the X direction, merges, and flows to the side away from the base plate 41 between the plurality of heat radiation fins 42 in the inner portion 42y. Therefore, the air can effectively flow between the plurality of heat radiation fins 42, and the cooling efficiency can be enhanced. The LED elements 32 on both end sides in the X direction, which are likely to become overheated, are preferentially cooled, so that the temperature of the plurality of LED elements 32 can be made uniform, and the occurrence of irradiation unevenness in the plurality of LED elements 32 can be suppressed.

In the active energy irradiation device 1, one end portions on the base plate 41 side of the duct 7 are inserted into the grooves 47 of the heat radiation fins 42. Accordingly, the duct 7 can be engaged with the heat radiation fins 42 using the grooves 47, and the need for a seal member such as a packing at a connection between the duct 7 and the heat radiation fins 42 can be eliminated.

In the active energy irradiation device 1, the one end portions on the base plate 41 side of the duct 7 are inserted into the grooves 47 of the heat radiation fins 42 through a heat conductive grease. Heat can be effectively transferred from the plurality of heat radiation fins 42 to the duct 7 by the heat conductive grease. Incidentally, instead of the heat conductive grease, other heat conductive materials may be used. Examples of the other heat conductive materials include a heat conductive sheet, a heat conductive tape, a heat conductive gel, and a heat conductive pad.

In the active energy irradiation device 1, the LED elements 32 perform irradiation with ultraviolet rays. Accordingly, the active energy irradiation device 1 can be used as a device that performs irradiation with ultraviolet rays.

The active energy irradiation system 100 includes the plurality of active energy irradiation devices 1, and the plurality of active energy irradiation devices 1 are arranged to be in contact with each other in the X direction. When the plurality of active energy irradiation devices 1 are arranged to be in contact with each other in the X direction, in each of the active energy irradiation devices 1, due to the influence of other adjacent active energy irradiation devices 1, the plurality of LED elements 32 are likely to become overheated (particularly, the LED elements 32 on both the end sides in the X direction are likely to become overheated). In this respect, since the active energy irradiation system 100 includes the active energy irradiation devices 1, the cooling efficiency can be enhanced, so that the overheating of the plurality of LED elements 32 can be suppressed.

Figure 13:
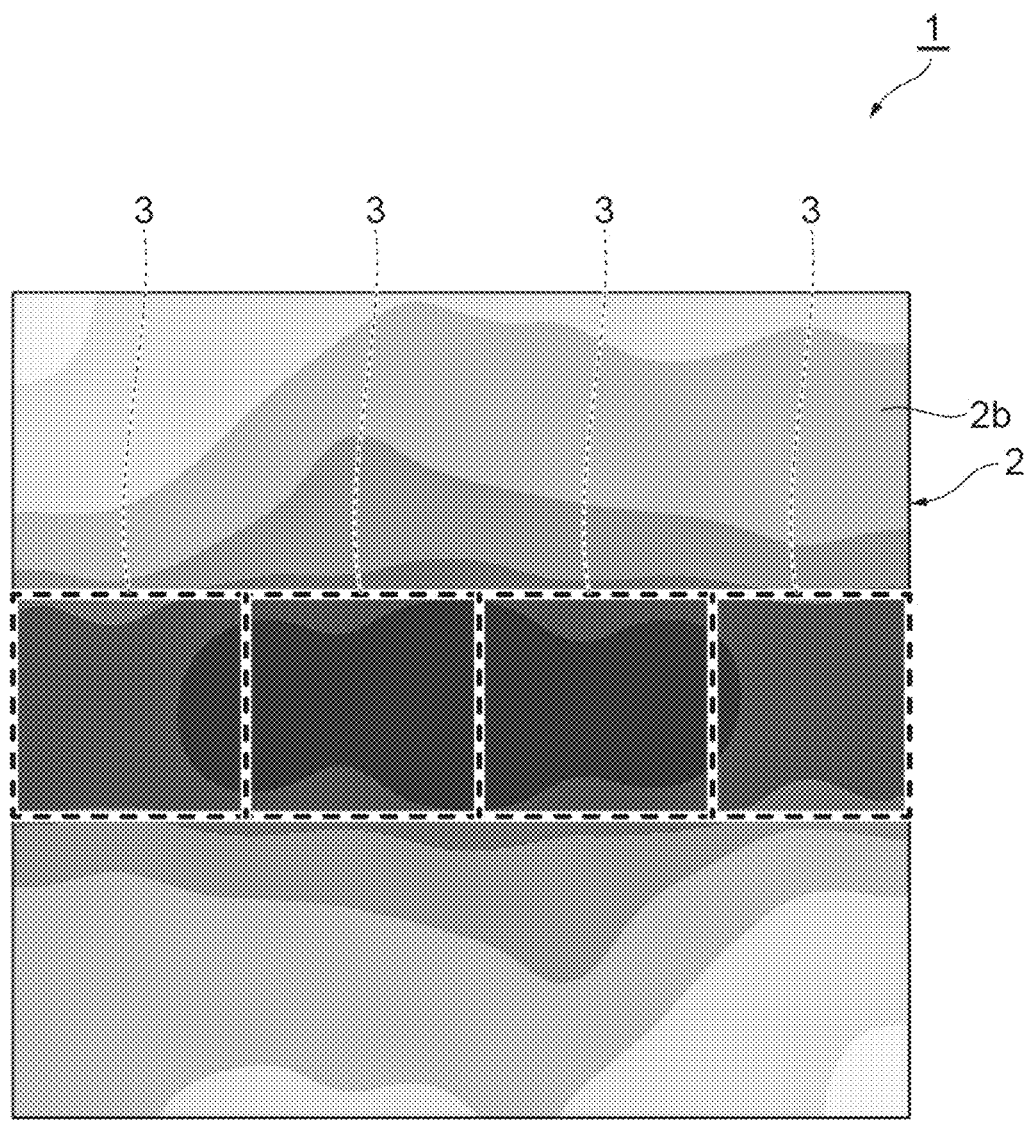
FIG. 13 is a view illustrating a thermal camera image of a periphery of LED substrates in the active energy irradiation device illustrated in FIG. 1.

FIG. 13 is a view illustrating a thermal camera image of a periphery of the LED substrates 3 in the active energy irradiation device 1. FIG. 13 is an image of the lower wall 2b of the housing 2 when viewed from below. As illustrated in FIG. 13, in the active energy irradiation device 1, it can be confirmed that the temperature profile of the plurality of LED substrates 3 (plurality of LED elements 32 (refer to FIG. 3)) can be made uniform through cooling. Incidentally, in the illustrated example, the temperature distribution of the plurality of LED substrates 3 can be made uniform with a temperature gradient within 2° C.

One mode of the present disclosure is not limited to the embodiment.

In the embodiment, the lower ends of the partition plates 44 of the heatsink 4 are spaced apart from the base plate 41; however, the configuration is not limited as long as the configuration allows more air to pass through in the X direction between the plurality of heat radiation fins 42 on the base plate 41 side than on the side opposite to the base plate 41 side, and the configuration may be as follows.

For example, a ventilation portion (for example, a hole, a mesh portion, or the like) allowing the air to pass through may be provided on the base plate 41 side in the partition plate 44. In this case, the ventilation portion can be used as a space through which the air passes. The configuration can be specifically realized in which more air passes through in the X direction between the plurality of heat radiation fins 42 on the base plate 41 side than on the side opposite to the base plate 41 side.

For example, the partition plate 44 may include a mesh portion, and the base plate 41 side of the mesh portion may have a larger opening ratio than that of the side opposite to the base plate 41 in the mesh portion. In this case, the mesh portion can be used as a space through which the air passes, and the base plate 41 side of the mesh portion can be used as a space through which more air passes. The configuration can be specifically realized in which more air passes through in the X direction between the plurality of heat radiation fins 42 on the base plate 41 side than on the side opposite to the base plate 41 side.

In the embodiment, the heatsink 4 includes the partition plates 44, but is not limited to including the partition plates 44, and may include other various partition members as long as the partition members can partition the heatsink 4. In the embodiment, the LED elements 32 as active energy irradiation units perform irradiation with ultraviolet rays; however, the active energy irradiation units may perform irradiation with electron beams. In this case, the active energy irradiation device can be used as a device that performs irradiation with electron beams.

In the embodiment, the heatsink 4 is used to radiate heat from the LED elements 32, and the LED element 32 is a heat-generating unit; however, the heat-generating unit from which the heatsink 4 has to radiate heat is not limited to the LED element 32, and may be other heat-generating units. In the embodiment, the lower end portions of the duct 7 are inserted into the grooves 47 of the heat radiation fins 42 of the heatsink 4; however, the object to be inserted into the grooves 47 is not limited to the duct 7, and may be other members. In this case, the other members can be engaged with the heat radiation fins 42 using the grooves 47.

In the embodiment, the duct 7 has a rectangular pipe shape; however, the shape of the duct 7 is not particularly limited, and may have, for example, other polygonal pipe shapes. In the embodiment, the exhaust unit 6 includes the fan 61; however, the configuration of the exhaust unit 6 is not particularly limited. For example, the exhaust unit 6 may include a pipe for discharging the air and the inert gas to the outdoors, without including the fan 61. In this case, the air and the inert gas may be delivered under pressure by a blower or the like at a connection destination on a downstream side of the pipe.

In the embodiment, an air presence region exists around the linear portion 71 and the enlarged portion 72 of the duct 7; however, the air presence region may exist around only one of the linear portion 71 and the enlarged portion 72, or the air presence region may exist around only a part of the linear portion 71 or a part of the enlarged portion 72.

In the embodiment, the inert gas suction unit 9 is detachably attached to the housing 2 by fasteners such as screws; however, the configuration for detachable attachment is not particularly limited, and a known configuration can be used. For example, the inert gas suction unit 9 may be detachably attached to the housing 2 by sliding the inert gas suction unit 9 with respect to the housing 2.

Figure 14:
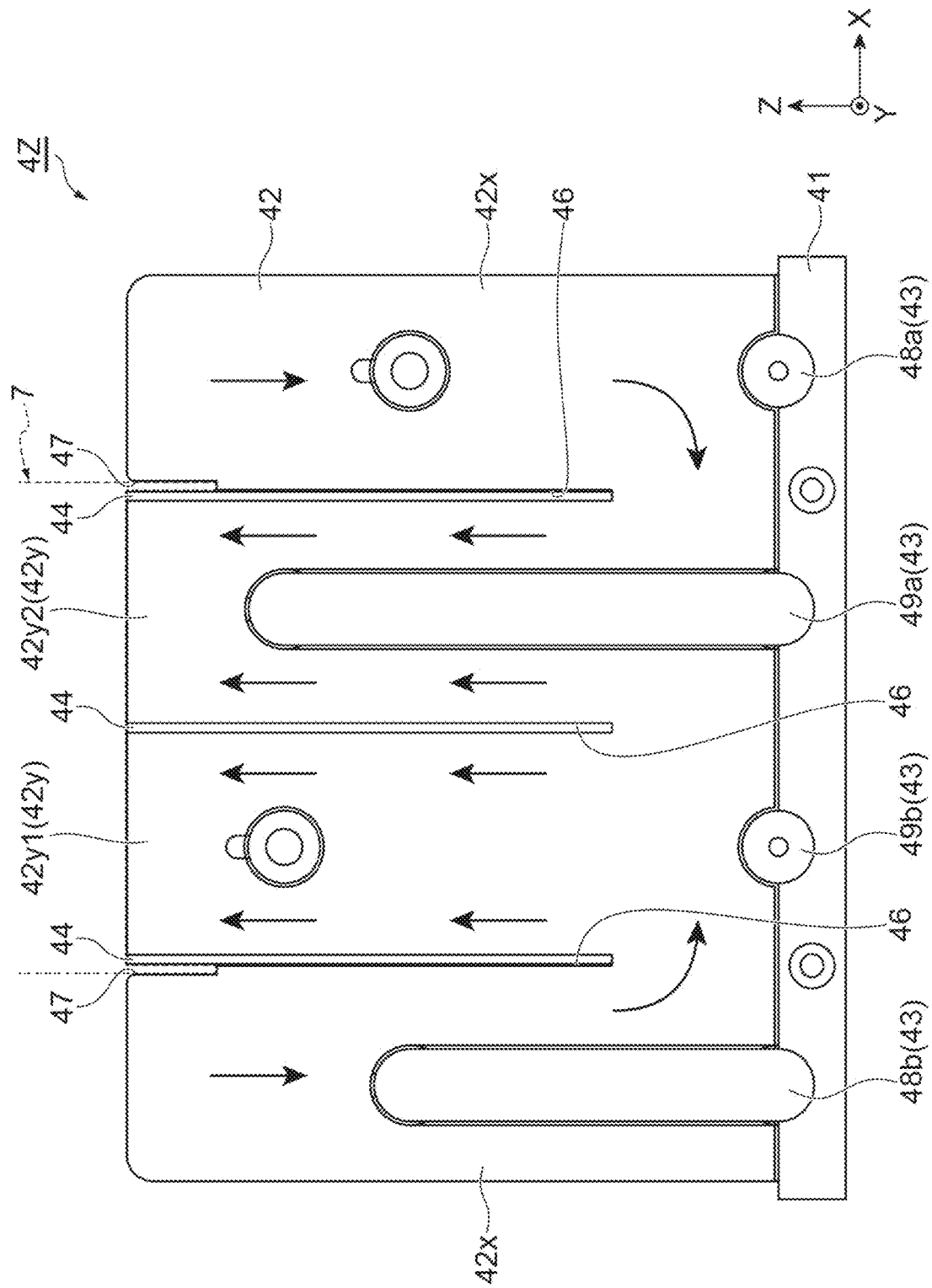
FIG. 14 is a front view of a heatsink according to a modification example.

In the embodiment, the heatsink 4 provided with the pair of partition plates 44 is used; however, the number of the partition plates 44 in the heatsink 4 is not limited, and may be one or plural. For example, as illustrated in FIG. 14, a heatsink 4Z may be used in which the partition plate 44 is further provided to partition the inner portion 42y of the heatsink 4 described above (refer to FIG. 10) in the X direction. The partition plate 44 that is further provided is disposed between the second heat pipes 49a and 49b in the X direction.

In the example illustrated in FIG. 14, the plurality of heat radiation fins 42 are partitioned into the pair of outer portions 42x and the inner portion 42y by the pair of partition plates 44, and the inner portion 42y is partitioned into a first inner portion 42y1 and a second inner portion 42y2 by the partition plate 44 that is further provided between the pair of partition plates 44. In the heatsink 4, the air flows to the base plate 41 side along the Z direction between the plurality of heat radiation fins 42 of each of the pair of outer portions 42x, and then flows to pass through between the partition plate 44 and the base plate 41 and to turn upward. Then, the air flows away from the base plate 41 along the Z direction between the plurality of heat radiation fins 42 of each of the first inner portion 42y1 and the second inner portion 42y2, and flows into the duct 7. Incidentally, for example, when the number of the heat pipes 43 in the heatsink 4 is further increased than in the embodiment, if the partition plate 44 does not exist between a pair of the heat pipes 43 adjacent to each other in the X direction among the plurality of heat pipes 43, the partition plate 44 may be further provided at the location.

Figure 15:
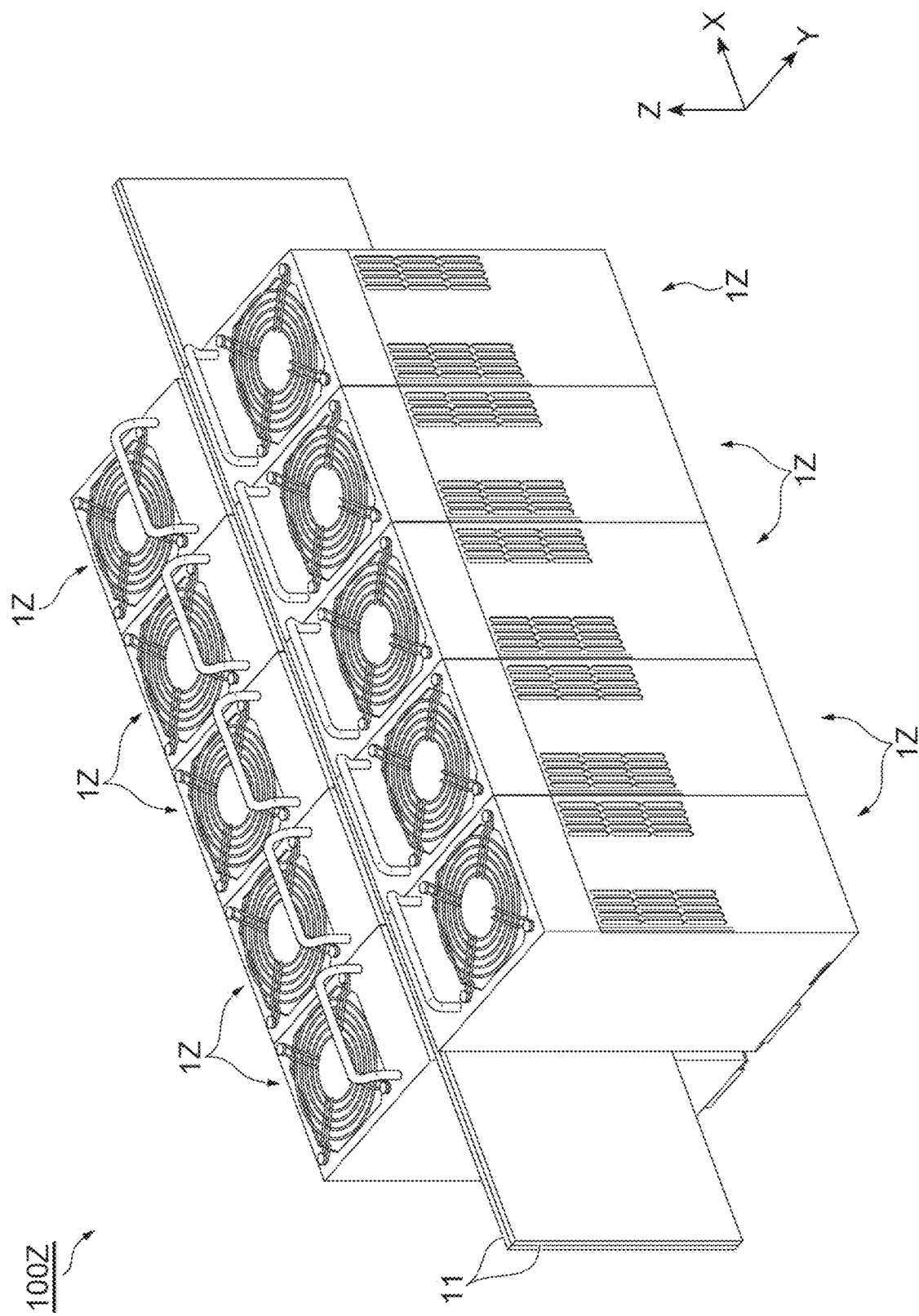
FIG. 15 is a perspective view of an active energy irradiation system according to a modification example.

In the embodiment, the active energy irradiation system 100 includes the plurality of active energy irradiation devices 1 arranged in one row in the X direction, but is not limited thereto. The number and disposition of the active energy irradiation devices according to one mode of the present disclosure is not particularly limited, may be changed as appropriate depending on the system specifications or the like, and, for example, may be configured as in an active energy irradiation system 100Z illustrated in FIG. 15. The active energy irradiation system 100Z includes a pair of units each including a plurality of active energy irradiation devices 1Z fixed to the fixing plate 11 and arranged to be in contact with each other in the X direction. In the example illustrated in FIG. 15, the active energy irradiation devices 1Z are arranged in the Y direction such that back surfaces (rear surfaces) of the active energy irradiation devices 1Z are in contact with each other. The active energy irradiation device 1Z has the same configuration as the active energy irradiation device 1 (refer to FIG. 2) except that the inert gas supply unit 8 is not provided. Incidentally, as illustrated in FIGS. 1 and 15, the plurality of active energy irradiation devices 1 and 1Z can be in contact (connection) with a cooling surface of the housing 2 (wall surface of the housing 2 which is adjacent to a region where air exists before passing through the heatsink 4 inside the housing 2).

In the embodiment, in the heatsinks 4 and 4Z, when viewed in the Y direction, at least one of a pair of facing sides among sides forming the slit 46 may be bent to enter the inside of the slit 46. In this case, when the partition plate 44 is inserted to be interposed in the slit 46, inner surfaces of the slit 46 act as a spring (caulking) due to the fact that the side is bent, and reliable contact between the partition plate 44 and the heat radiation fins 42 is obtained, so that heat can be effectively transferred therebetween.

Various materials and shapes can be applied to each configuration in the embodiment and the modification examples described above without being limited to the materials and shapes described above. In addition, each configuration in the embodiment or the modification examples described above can be arbitrarily applied to each configuration in other embodiments or modification examples.

REFERENCE SIGNS LIST 1, 1Z: active energy irradiation device, 2: housing, 4, 4Z: heatsink, 5: intake unit, 6: exhaust unit, 7: duct, 8: inert gas supply unit, 9: inert gas suction unit, 32: LED element (heat-generating unit, active energy irradiation unit), 42: heat radiation fin, 42x: outer portion, 42y: inner portion, 43: heat pipe, 44: partition plate (partition member), 46: slit, 47: groove, 48a, 48b: first heat pipe, 49a, 49b: second heat pipe, 100, 100Z: active energy irradiation system, BF: buffer space (flow path).

The invention claimed is:

1. A heatsink comprising:
a base plate thermally connected to a heat-generating unit;
a plurality of heat radiation fins erected on a surface of the base plate, and arranged with gaps in a first direction along the surface; and a partition member provided to intersect the plurality of heat radiation fins, and partitioning the plurality of heat radiation fins in a second direction along the surface and intersecting the first direction, wherein the partition member partitions the plurality of heat radiation fins such that more air passes through in the second direction between the plurality of heat radiation fins on a base plate side than on a side opposite to the base plate side.

2. The heatsink according to claim 1,
wherein an end on the base plate side of the partition member is spaced apart from the base plate.

3. The heatsink according to claim 1,
wherein a ventilation portion allowing the air to pass through is provided on the base plate side of the partition member.

4. The heatsink according to claim 1,
wherein the partition member includes a mesh portion, and
the base plate side of the mesh portion has a larger opening ratio than an opening ratio of the side opposite to the base plate side in the mesh portion.

5. The heatsink according to claim 1,
wherein the partition member is brazed to the plurality of heat radiation fins.

6. The heatsink according to claim 1,
wherein a slit that is open on the side opposite to the base plate side is formed in the plurality of heat radiation fins, and
the partition member is interposed in the slit of the plurality of heat radiation fins.

7. The heatsink according to claim 6,
wherein when viewed in the first direction, at least one of a pair of facing sides among sides forming the slit is bent to enter an inside of the slit.

8. The heatsink according to claim 1,
wherein a pair of the partition members are provided spaced apart from each other.

9. An active energy irradiation device comprising:
the heatsink according to claim 8;
a plurality of active energy irradiation units thermally connected to the base plate of the heatsink, and arranged at least along a predetermined direction; and
a housing that houses the heatsink and the active energy irradiation units,
wherein the pair of partition members of the heatsink partition the plurality of heat radiation fins of the heatsink into a pair of outer portions located outside in the predetermined direction and an inner portion located between the pair of outer portions, and
a flow path allowing the air to flow into the gaps between the plurality of heat radiation fins in the pair of outer portions from the side opposite to the base plate side is provided inside the housing.

10. The heatsink according to claim 1, further comprising:
a heat pipe provided to be embedded in the plurality of heat radiation fins and thermally connected to the plurality of heat radiation fins.

11. The heatsink according to claim 10,
wherein the heat pipe includes a pair of first heat pipes provided spaced apart from each other so as to be embedded in the plurality of heat radiation fins, and a pair of second heat pipes provided spaced apart from each other so as to be embedded between the pair of first heat pipes in the plurality of heat radiation fins, and longer than the first heat pipes, and
the partition members are each provided between one first heat pipe and one second heat pipe adjacent to each other and between the other first heat pipe and the other second heat pipe adjacent to each other.

12. The heatsink according to claim 1,
wherein grooves that are open on the side opposite to the base plate side are each formed in the plurality of heat radiation fins.

13. An active energy irradiation device comprising:
the heatsink according to claim 12;
a plurality of active energy irradiation units thermally connected to the base plate of the heatsink, and arranged at least along a predetermined direction;
a housing that houses the heatsink and the active energy irradiation units;
an exhaust unit that is provided in the housing, and that discharges the air, which has passed through the heatsink, to an outside of the housing; and
a duct provided between the heatsink and the exhaust unit inside the housing, and allowing the air, which has passed through the heatsink, to flow through to the exhaust unit,
wherein one end portion on the base plate side of the duct is inserted into the grooves.

14. The active energy irradiation device according to claim 13,
wherein the one end portion on the base plate side of the duct is inserted into the grooves through a heat conductive material.

15. An active energy irradiation device comprising:
the heatsink according to claim 1;
a plurality of active energy irradiation units thermally connected to the base plate of the heatsink, and arranged at least along a predetermined direction; and
a housing that houses the heatsink and the active energy irradiation units,
wherein a flow path allowing the air to flow into the gaps between the plurality of heat radiation fins from the side opposite to the base plate side is provided inside the housing.

16. The active energy irradiation device according to claim 15,
wherein the active energy irradiation units perform irradiation with an ultraviolet ray or an electron beam.

17. An active energy irradiation system comprising:
a plurality of the active energy irradiation devices according to claim 15,
wherein the plurality of active energy irradiation devices are arranged to be in contact with each other in the predetermined direction.

* * * * *